United States Patent [19]

Hori et al.

[11] Patent Number: 4,800,515
[45] Date of Patent: Jan. 24, 1989

[54] CIRCUIT FOR OPERATING FINITE FIELDS

[75] Inventors: Katsuya Hori; Tsuneo Furuya, both of Kanagawa, Japan

[73] Assignee: Sony Corporation, Tokyo, Japan

[21] Appl. No.: 776,202

[22] PCT Filed: Jan. 18, 1985

[86] PCT No.: PCT/JP85/00017
§ 371 Date: Jun. 16, 1985
§ 102(e) Date: Jun. 16, 1985

[87] PCT Pub. No.: WO85/03371
PCT Pub. Date: Aug. 1, 1985

[30] Foreign Application Priority Data

Jan. 21, 1984 [JP] Japan ................................ 59-9150
Jan. 31, 1984 [JP] Japan ................................ 59-15704

[51] Int. Cl.⁴ ............................................... G06F 7/38
[52] U.S. Cl. .................................. 364/746.1; 364/754; 364/761
[58] Field of Search .................. 364/754, 757–760, 364/761; 371/37

[56] References Cited

U.S. PATENT DOCUMENTS

| | | | |
|---|---|---|---|
| 4,037,093 | 7/1977 | Gregg et al. | |
| 4,142,174 | 2/1979 | Chen et al. | 371/37 |
| 4,242,752 | 12/1980 | Herkert | 371/37 |
| 4,251,875 | 2/1981 | Marver et al. | 364/754 |
| 4,346,451 | 8/1982 | Katayama | 364/746 |
| 4,366,549 | 12/1982 | Katayama | 364/746 X |
| 4,473,887 | 9/1984 | Odaka | 364/754 |
| 4,502,141 | 2/1985 | Kuki | 371/37 |
| 4,567,568 | 1/1986 | Inagawa et al. | 364/751 |
| 4,574,361 | 3/1986 | Inagawa et al. | 364/761 |
| 4,583,225 | 4/1986 | Yamada et al. | 371/37 |
| 4,649,541 | 3/1987 | Lahmeyer | 371/37 |

FOREIGN PATENT DOCUMENTS 0061345 9/1982 European Pat. Off. .
0096165 12/1983 European Pat. Off. .

OTHER PUBLICATIONS

3rd International Conference, "The Technology and Applications of Charge Coupled Devices", Sep. 1976, pp. D1–D13.

Primary Examiner—Gary V. Harkcom
Assistant Examiner—Tan V. Mai
Attorney, Agent, or Firm—Hill, Van Santen, Steadman & Simpson

[57] ABSTRACT

A circuit for operating finite fields performs multiplication or division using an accumulator for storing an arbitrary element and an adder for performing modulo 2 addition, using the contents of the accumulator and a vector representation of the primitive polynomial; or first and second tables for translating exponents with elements of the polynomial over the finite field, with a binary arithmetic unit for performing addition or subtraction using such exponents.

3 Claims, 7 Drawing Sheets

Fig. 7

| $\alpha^i$ | address | | | | | | | | | i |
|---|---|---|---|---|---|---|---|---|---|---|
| | n | | | | | | | | | |
| $\alpha^0$ | n + 1 | 0 | 0 | 0 | 0 | 0 | 0 | 0 | 0 | 0 |
| $\alpha^1$ | n + 2 | 0 | 0 | 0 | 0 | 0 | 0 | 0 | 1 | 1 |
| $\alpha^6$ | n + 3 | 0 | 0 | 0 | 0 | 0 | 1 | 1 | 0 | 6 |
| $\alpha^2$ | n + 4 | 0 | 0 | 0 | 0 | 0 | 0 | 1 | 0 | 2 |
| $\alpha^{12}$ | n + 5 | 0 | 0 | 0 | 0 | 1 | 1 | 0 | 0 | 12 |
| $\alpha^7$ | n + 6 | 0 | 0 | 0 | 0 | 0 | 1 | 1 | 1 | 7 |
| $\alpha^{26}$ | n + 7 | 0 | 0 | 0 | 1 | 1 | 0 | 1 | 0 | 26 |
| $\alpha^3$ | n + 8 | 0 | 0 | 0 | 0 | 0 | 0 | 1 | 1 | 3 |
| $\alpha^{29}$ | n + 56 | 0 | 0 | 0 | 1 | 1 | 1 | 0 | 1 | 29 |
| $\alpha^{60}$ | n + 57 | 0 | 0 | 1 | 1 | 1 | 1 | 0 | 0 | 60 |
| $\alpha^{42}$ | n + 58 | 0 | 0 | 1 | 0 | 1 | 0 | 1 | 0 | 42 |
| $\alpha^{21}$ | n + 59 | 0 | 0 | 0 | 1 | 0 | 1 | 0 | 1 | 21 |
| $\alpha^{20}$ | n + 60 | 0 | 0 | 0 | 1 | 0 | 1 | 0 | 0 | 20 |
| $\alpha^{59}$ | n + 61 | 0 | 0 | 1 | 1 | 1 | 0 | 1 | 1 | 59 |
| $\alpha^{57}$ | n + 62 | 0 | 0 | 1 | 1 | 1 | 0 | 0 | 1 | 57 |
| $\alpha^{58}$ | n + 63 | 0 | 0 | 1 | 1 | 1 | 0 | 1 | 0 | 58 |

Fig. 8

| i | address | | | | | | | | | $\alpha^i$ |
|---|---|---|---|---|---|---|---|---|---|---|
| 0 | m | 0 | 0 | 0 | 0 | 0 | 0 | 0 | 1 | $\alpha^0$ |
| 1 | m + 1 | 0 | 0 | 0 | 0 | 0 | 0 | 1 | 0 | $\alpha^1$ |
| 2 | m + 2 | 0 | 0 | 0 | 0 | 0 | 1 | 0 | 0 | $\alpha^2$ |
| 3 | m + 3 | 0 | 0 | 0 | 0 | 1 | 0 | 0 | 0 | $\alpha^3$ |
| 4 | m + 4 | 0 | 0 | 0 | 1 | 0 | 0 | 0 | 0 | $\alpha^4$ |
| 5 | m + 5 | 0 | 0 | 1 | 0 | 0 | 0 | 0 | 0 | $\alpha^5$ |
| 6 | m + 6 | 0 | 0 | 0 | 0 | 0 | 0 | 1 | 1 | $\alpha^6$ |
| 7 | m + 7 | 0 | 0 | 0 | 0 | 0 | 1 | 1 | 0 | $\alpha^7$ |
| 8 | m + 8 | 0 | 0 | 0 | 0 | 1 | 1 | 0 | 0 | $\alpha^8$ |
| 56 | m + 56 | 0 | 0 | 0 | 1 | 1 | 1 | 1 | 1 | $\alpha^{56}$ |
| 57 | m + 57 | 0 | 0 | 1 | 1 | 1 | 1 | 1 | 0 | $\alpha^{57}$ |
| 58 | m + 58 | 0 | 0 | 1 | 1 | 1 | 1 | 1 | 1 | $\alpha^{58}$ |
| 59 | m + 59 | 0 | 0 | 1 | 1 | 1 | 1 | 0 | 1 | $\alpha^{59}$ |
| 60 | m + 60 | 0 | 0 | 1 | 1 | 1 | 0 | 0 | 1 | $\alpha^{60}$ |
| 61 | m + 61 | 0 | 0 | 1 | 1 | 0 | 0 | 0 | 1 | $\alpha^{61}$ |
| 62 | m + 62 | 0 | 0 | 1 | 0 | 0 | 0 | 0 | 1 | $\alpha^{62}$ |
| | m + 63 | | | | | | | | | |

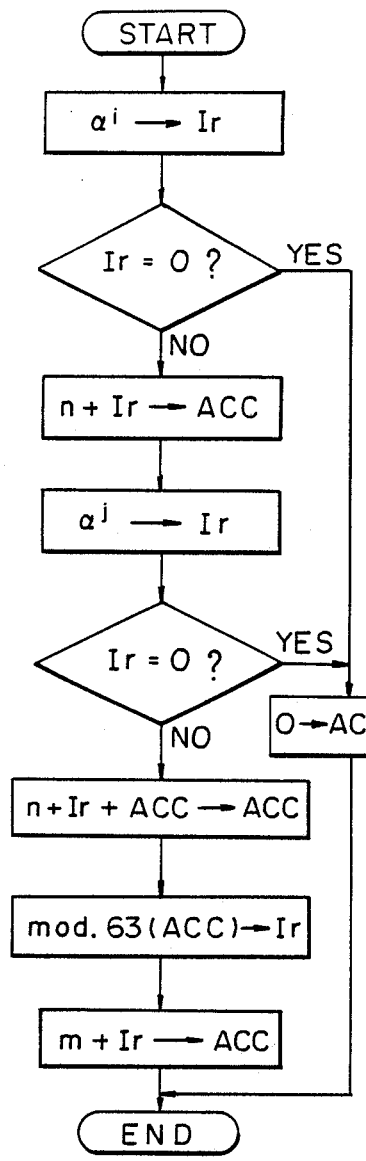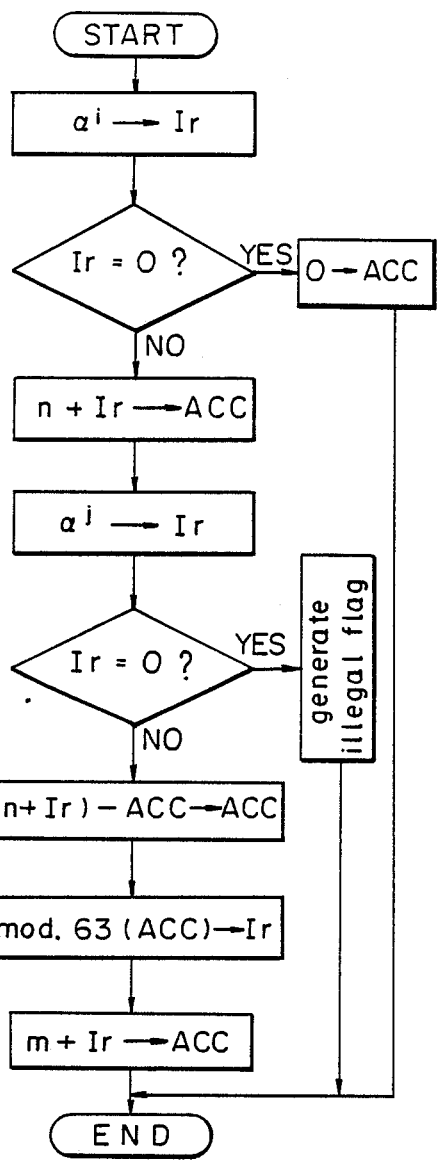

CIRCUIT FOR OPERATING FINITE FIELDS

BACKGROUND OF THE INVENTION

The present invention relates to a circuit for operating finite fields which is used for an encoder and a decoder of error correction codes.

When a digital video signal, a digital audio signal or the like is recorded or reproduced, adjacent codes, Reed Solomon codes or the like have been put to practical use as error correction codes. In the encoder of these error correction codes, parity data (redundant data) is generated. In the decoder, a syndrome is generated from the received word including parity data and the error correction is performed using this syndrome. Circuit for operating finite fields is used as a hardware of these parity generating circuit, syndrome generating circuit and error correcting circuit. The finite field is the field having $p^m$ elements derived from the primitive polynomial $P(x)$ of a degree of m. The case of (p=2) is important with respect to the error correction codes and this invention, accordingly, is applied to the finite field of (p=2).

A continued product of which an involution of $\alpha$ was multiplied to an arbitrary element $\alpha^i$ over the finite field is used as the circuit for operating finite fields which is used for the encoder and decoder. For this multiplication, $\alpha^i$ is inputted to a ROM and thereby obtaining an exponent i. Thus, a ROM is needed and there is a drawback such that the circuit scale becomes large. On one hand, in case of a degree of m, a discrimination in mod. $(2^m - 1)$ is required with regard to the exponent and there is a drawback such that this discrimination becomes troublesome because it is not the involution of 2.

The Reed Solomon codes are used as the error correction codes in the main channel of a digital audio disc (referred to as a compact disc), and the decoding circuit has an arrangement of a hard wired method using a TTL circuit. Since recently, the operation speed of a microprocessor has been remarkably improved and also the memory capacity has been extremely increased, if the error correcting circuit is constituted by a general microprocessor, there is no need to design a new LSI and the cost can be reduced. In particular, the data rate of the subcoding signal of the foregoing digital audio disc is lower than that in the main channel. In addition, in case of recording digital data such as video data or the like using the digital audio disc, a temporary buffering of the reproduced data can be performed. In these cases, the decoder of the error correction codes can be realized by a general microprocessor.

It is therefore an object of the present invention to provide a circuit for operating finite fields in which the necessary quantity of memory such as a ROM, a register or the like is reduced and the circuit scale is made small.

Another object of the invention is to provide a circuit for operating finite fields in which by reducing the necessary number of memories, the number of steps is decreased and thereby enabling the processing speed in arithmetic operation to be made high.

Still another object of the invention is to provide a circuit for operating finite fields in which a multiplication or a division in relation to arbitrary two elements over the finite field can be performed by way of a program stored method.

Further another object of the invention is to provide a circuit for operating finite fields which is suitable for an encoder and a decoder of error correction codes.

SUMMARY OF THE INVENTION

The present invention relates to a circuit for operating finite fields which performs a multiplication or a division in relation to arbitrary elements $\alpha^i$ and $\alpha$ over a finite field (where, $\alpha$ is a root of a primitive polynomial of the finite field), wherein this circuit includes: an accumulator to store the arbitrary element $\alpha^i$; an adder to perform a module 2 addition of the contents of the accumulator and represented by a vector the primitive polynomial; and a control section to control the bit-shift of the accumulator and the operation of the adder in accordance with a program.

The present invention also relates to a circuit for operating finite field which performs a multiplication or a division in relation to two elements $\alpha^i$ and $\alpha^j$ over a finite field (where, $\alpha$ is a root of a primitive polynomial of the finite field), wherein this circuit includes: a first table to generate the exponents from the elements over the finite field; a second table to generate the elements over the finite field from the exponents; a binary arithmetic operating unit to perform an addition or a subtraction in relation to the exponents; and a control section to control the data conversions which are performed by the first and second tables and the operation of the binary arithmetic operating unit in accordance with a program.

BRIEF DESCRIPTION OF THE DRAWINGS

FIGS. 7 and 8 are schematic diagrams which are used to explain tables in another embodiment;

FIG. 9 is a flowchart which is used to explain the multiplying operation in another embodiment;

FIG. 10 is a flowchart which is used to explain the dividing operation in another embodiment;

BEST MODE FOR CARRYING OUT THE INVENTION

Figures 1, 5A, 5B, 5C:
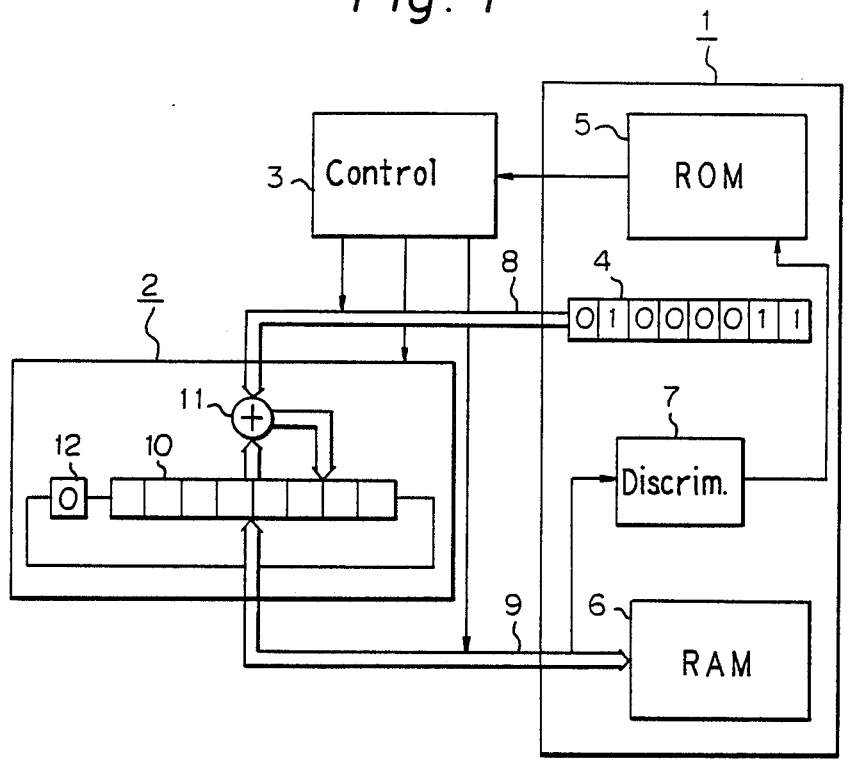
FIG. 1 is a block diagram of one embodiment of the present invention.
FIGS. 4 and 5A–5C are a flowchart and schematic diagrams which are used to explain the dividing operation in this embodiment.

One embodiment of the present invention will now be described with reference to FIG. 1. In FIG. 1, a reference numeral 1 denotes a memory section, 2 indicates an accumulator and an arithmetic operating section, and 3 is a control section. In this embodiment, $(P(x) = x^6 + x + 1)$ over the GF $(2^6)$ is used as a primitive polynomial.

In this case, each element is expressed by $$a_5X^5+a_4X^4+a_3X^3+a_2X^2+a_1X+a_0$$

By multiplying $\alpha$ to this element, we have $$a_5X^6+a_4X^5+a_3X^4+a_2X^3+a_1X^2+a_0X$$

When ($a_5=0$), $$a_4X^5+a_3X^4+a_2X^3+a_1X^2+a_0X$$

and when ($a_5=1$), $$X^6=X+1$$

Therefore, we have $$a_4X^5+a_3X^4+a_2X^3+a_1X^2+(a_0+1)X+1$$

According to the vector expression, when ($a_5=0$), $$(a_4, a_3, a_2, a_1, a_0, 0)$$

and when ($a_5=1$), $$(a_4, a_3, a_2, a_1, a_0+1, 1)$$

(01000011) of which "0" was further added to the higher significant bits of the primitive polynomial P(x) represented by a vector is stored in a register 4 in the memory section 1. A programmable ROM 5, a RAM 6 and a discriminating circuit 7 are provided in the memory section 1. An address from this address generating section (not shown) which is supplied with a discrimination output of the discriminating circuit 7 is supplied to the programmable ROM 5, so that instructions from the programmable ROM 5 are generated in accordance with a predetermined sequence. These instructions are supplied to the control section 3, so that control signals to respectively control paths 8 and 9 and the accumulator and arithmetic operating section 2 are generated from the control section 3.

The accumulator and arithmetic operating section 2 has an accumulator 10 and an adder 11 for performing the addition of (mod. 2) in relation to the contents of the accumulator 10 and the contents of the register 4 derived through the path 8 and then supplying the addition output to the accumulator 10. The accumulator 10 performs the operation to shift to the left by one bit or to shift to the right by one bit in response to the control signal from the control section 3. Upon this shifting operation, the bit in the edge portion is set to "0" by an output of a register 12. The data from the RAM 6 is set into the accumulator 10 through the path 9 and also the arithmetic operation output is supplied to the RAM 6 through the path 9.

Figure 2:
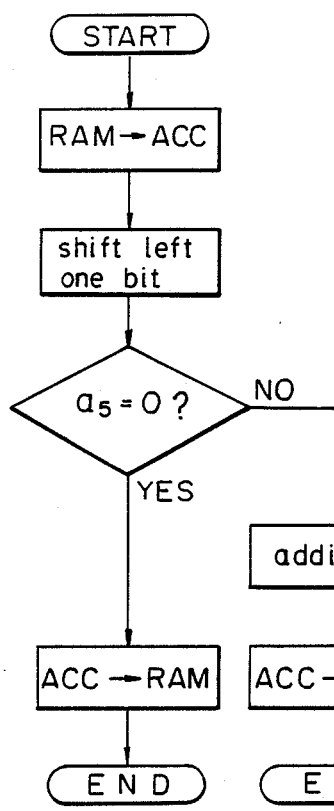
FIGS. 2 and 3A–3C are a flowchart and schematic diagrams which are used to explain the multiplying operation in this embodiment.

The operation when the multiplication between arbitrary elements $\alpha^i$ and $\alpha$ over the GF ($2^6$) is performed in the foregoing embodiment of the present invention will be described with reference to FIGS. 2 and 3.

Figure 3A:
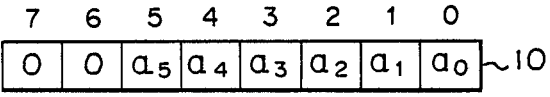

First, six bits for representing $\alpha^i$ by a vector are read out from the RAM 6 and are stored into the accumulator 10 through the path 9. Assuming that eight bits in the accumulator 10 are bits 0 to 7, six bits ($a_5, a_4, a_3, a_2, a_1, a_0$) representing $\alpha^i$ by a vector are stored into bits 0 to 5 as shown in FIG. 3A.

Figure 3B:
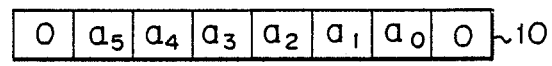
Figure 3C:
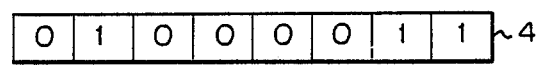

In next step, the bits in the accumulator 10 are shifted to the left by one bit. FIG. 3B shows the state in that those bits were shifted to the left by one bit. A check is made by the discriminating circuit 7 to see if the bit 6 in the accumulator 10, namely, $a_5$ is "0" or not. When ($a_5=0$), six bits ($a_4, a_3, a_2, a_1, a_0, 0$) of the bits 0 to 5 in the accumulator 10 are set to the multiplication output of ($\alpha^i \times \alpha$) and are outputted from the accumulator 10 through the path 9 to the RAM 6.

When ($a_5=1$), the contents of the accumulator 10 (FIG. 3B) and the contents of the register 4 (FIG. 3C) in the memory section 1 are added by the adder 11 of (mod. 2). Six bits of the bits 0 to 5 of this addition output become ($a_4, a_3, a_2, a_1, a_0+1, 1$) and this addition output is set to the multiplication output of ($\alpha^1 \times \alpha$) and is outputted from the accumulator 10 through the path 9 to the RAM 6.

When the root of the primitive polynomial (P(x)=$x^6+x+1$) is $\alpha$, the vector expression becomes practically as shown below, wherein ($\alpha^0$ to $\alpha^{12}$) are shown for simplicity.

$$\alpha^0=(000001)$$
$$\alpha^1=(000010)$$
$$\alpha^2=(000100)$$
$$\alpha^3=(001000)$$
$$\alpha^4=(010000)$$
$$\alpha^5=(100000)$$
$$\alpha^6=(000011)$$
$$\alpha^7=(000110)$$
$$\alpha^8=(001100)$$
$$\alpha^9=(011001)$$
$$\alpha^{10}=(110001)$$
$$\alpha^{11}=(100011)$$
$$\alpha^{12}=(000101)$$

When this invention is applied to the multiplication of ($\alpha^{11} \times \alpha$) as an example, the adding operation is performed since ($a_5=1$), so that the multiplication output of (000101), namely, $\alpha^{12}$ can be obtained.

Figure 4:
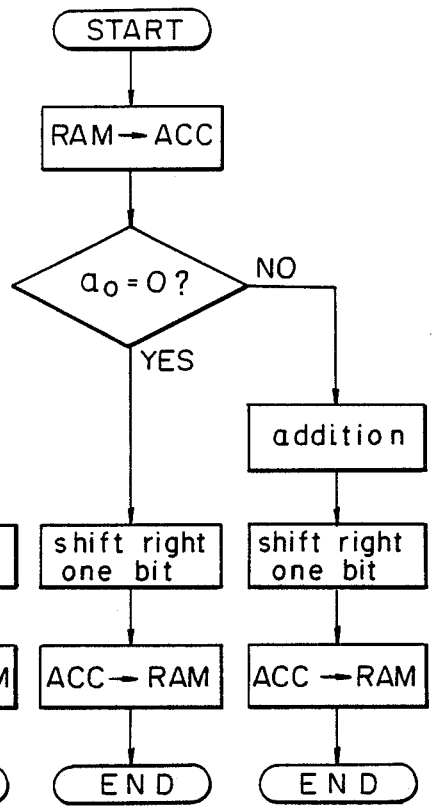

On the other hand, in this embodiment, the division of ($\alpha^{11} \times \alpha$) can be performed. FIG. 4 shows a flowchart for the dividing operation. First, six bits ($a_5$ to $a_0$) representing $\alpha^i$ by a vector from the RAM 6 through the path 9 are stored into the bits 0 to 5 in the accumulator 10 as shown in FIG. 5A. Next, a check is made by the discriminating circuit 7 to see if the bit 0, namely, $a$: is "0" or not. When ($a_0=0$), the bits in the accumulator 10 are shifted to the right by one bit and they become as shown in FIG. 5B. Then, the bits 0 to 5 in the accumulator 10 are supplied as the division output to the RAM 6 through the path 9 and are stored in the RAM 6.

When ($a_0=1$), the contents shown in FIG. 5A of the accumulator 10 and the contents shown in FIG. 5C of the register 4 obtained through the path 8 are added by the adder 11 in (mod. 2). This addition output is shifted to the right by one bit and the bits 0 to 5 in the accumulator 10 are supplied as the division output through the path 9 to the RAM 6 and are stored into the RAM 6.

As a practical example, in case of performing the division of ($\alpha^6 \div \alpha$), ($\alpha^6=000011$) is stored into the accumulator 10 and the adding operation is executed since ($a_0=1$). The contents of the accumulator 10 into which the addition output was stored becomes (01000000) and the contents (100000=$\alpha^5$) of the bits 0 to 5 after the shifting operation to the right by one bit becomes the division output.

Further, the multiplication of ($\alpha^i \times \alpha^n$) or division of ($\alpha^i \div a^n$) may be executed by repeating the foregoing arithmetic operation steps n times.

Figure 6:
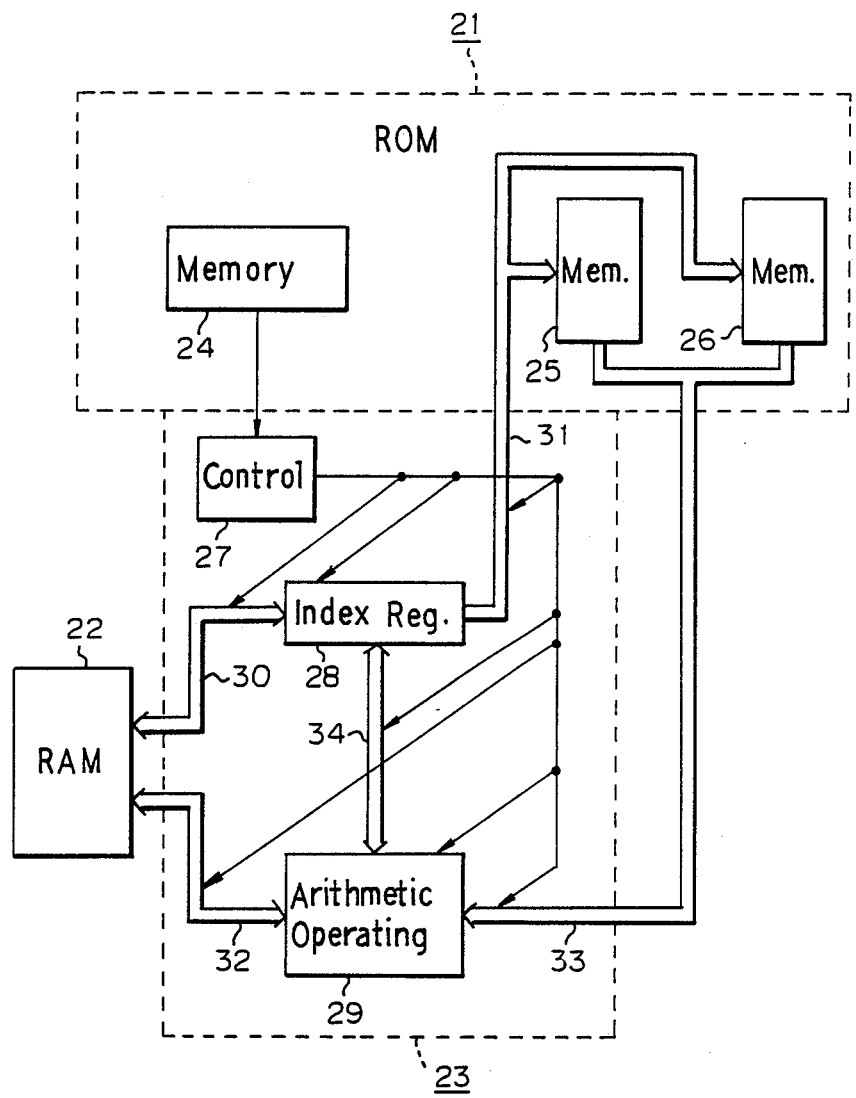
FIG. 6 is a block diagram of another embodiment of the present invention.

FIG. 6 shows another embodiment of the present invention. In this embodiment, the invention is applied to an arithmetic operating circuit which performs a multiplication or a division in relation to arbitrary two elements $\alpha^i$ and $\alpha^j$ over the finite field.

In FIG. 6, a reference numeral 21 denotes a ROM, 22 is a RAM and 23 is a CPU, respectively. The RAM 21 has: a memory area 24 in which instructions of a program have been written; a memory area 25 in which a first table for data conversion has been written; and a memory area 26 in which a second table has been written. In the case where the primitive polynomial is, for instance, ($P(x)=x^6+x+1$) over the GF ($2^6$), assuming that the root of the primitive polynomial is $\alpha$, sixty-four elements consisting of $\alpha^0$ to $\alpha^{62}$ and zero element exist.

As shown in FIG. 7, the table in the memory area 25 of the ROM 21 has addresses n to (n+63). The element $\alpha^i$ represented by a vector over the GF ($2^6$) is supplied as this address and its exponent i is outputted as a data. When the vector representing $\alpha^i$ is rearranged in accordance with the sequence such that it increases from ($\alpha^0=00000001$) one by one, it becomes ($\alpha^1, \alpha^6, \alpha^2, \ldots \alpha^{59}, \alpha^{57}, \alpha^{58}$). Since a ROM of an 8-bit unit is used as the ROM 21, each data in the table consists of eight bits and all of most two significant bits of each data are "0" and the vector representing $\alpha^i$ also has an 8-bit unit of which two bits of "0" as the higher significant bits were added to the six bits. On one hand, no data is written in the address n corresponding to the zero element whereby $\alpha^i$ becomes "0".

As shown in FIG. 8, the table in the memory area 26 of the ROM 21 has addresses of m to (m+63). The exponents i of 0 to 62 are supplied as these addresses and $\alpha^i$ is outputted as a data. This data is the vector representing $\alpha^i$ which has an 8-bit unit of which two bits as the higher significant bits were added to the six bits. Since the address (m+63) becomes ($\alpha^{63}=\alpha^0$), this address is actually not used.

The CPU 23 is provided with a control section 27, an index register 28 and an arithmetic operating section 29 including an accumulator. The index register 28 is coupled to the ROM 22 through a path 30, while the arithmetic operating section 29 is coupled to the RAM 22 through a path 32. The contents of the index register 28 is used as the addresses into the memory area 25 and 26 of the ROM 21 through a path 31 and is also supplied to the arithmetic operating section 29 through a path 34. The data which are outputted from the memory areas 25 and 26 of the ROM 21 are supplied to the arithmetic operating section 29 through a path 33. The control section 27 receives the instructions read out from the memory area 24 of the ROM 21 and generates control signals to control the index register 28, arithmetic operating section 29, and paths 30 to 34. Although not shown, an output of an address counter is supplied into the memory area 24.

In the foregoing another embodiment of the invention, when the multiplication ($\alpha^i \times \alpha^j$) in relation to arbitrary two elements $\alpha^i$ and $\alpha^j$ over the GF ($2^6$) is performed, the operation will be explained. In FIG. 9, the index register 28 is represented as Ir and the accumulator in the arithmetic operating section 29 is expressed as ACC.

First, the data representing the element $\alpha^i$ by a vector is transferred from the RAM 22 through the path 30 to the index register 28. A check is made to see if the element $\alpha^i$ stored into the index register 28 is the zero element or not. When it is the zero element, the multiplication output is obviously zero; therefore, the zero element is transferred through the path 34 to the accumulator in the arithmetic operating section 29. Then, the arithmetic operation is finished.

If the $\alpha^i$ is not the zero element, the result of which n was added to the content of the index register 28 is supplied as an address to the ROM 21 through the path 31. The exponent i is accessed from the ROM 21 by way of the table in the memory area 25 and the exponent i is stored into the accumulator in the arithmetic operating section 29 through the path 33.

Next, the element $\alpha^j$ is read out from the RAM 22 and is stored through the path 30 into the index register 28 and a check is made to see if this $\alpha^j$ is the zero element or not. If it is the zero element, the multiplication output becomes apparently zero; consequently, the zero element is stored through the path 34 into the accumulator in the arithmetic operating section 29. Then, the multiplying operation is finished.

If the $\alpha^j$ is not the zero element, the result of which n was added to the contents of the index register 28 is supplied as an address through the path 31 into the ROM 21. The exponent j is accessed from the ROM 21 by way of the table in the memory area 25 and the exponent j is supplied through the path 33 to the arithmetic operating section 29. The addition of (i+j) is performed in the arithmetic operating section 29 and the addition result is stored into the accumulator in the arithmetic operating section 29. In the arithmetic operating section 29, the operation of (mod. 63) in relation to (i+j) is executed and the value of this (i+j) (mod. 63) is stored through the path 34 into the index register 28. The result of which m was added to the contents of the index register 28 is supplied as an address through the path 31 into the ROM 21. The value representing the element $\alpha^{i+j}$ by a vector is accessed by way of the table in the memory area 26 and is stored through the path 33 into the accumulator in the arithmetic operating section 29. This value representing ($\alpha^i \times \alpha^j$) by a vector is returned through the path 32 into the RAM 22 as necessary.

In this another embodiment of the invention, when the division ($\alpha^i \div \alpha^j$) of two arbitrary elements $\alpha^i$ and $\alpha^j$ over the GF ($2^6$) is performed, the operation will be explained with reference to FIG. 10.

First, the data representing of the element $\alpha^i$ by a vector is transferred from the RAM 22 through the path 30 into the index register 28. A check is made to see if the $\alpha^i$ stored into the index register 28 is the zero element or not. If it is the zero element, the division output is obviously "0"; therefore, the zero element is stored through the path 34 into the accumulator in the arithmetic operating section 29.

If the $\alpha^i$ is not the zero element, the result of which n was added to the contents of the index register 28 is supplied as an address through the path 31 into the ROM 21. The exponent i is accessed from the ROM 21 by way of the table in the memory area 25 and the exponent i is stored through the path 33 into the accumulator in the arithmetic operating section 29.

Next, the element $\alpha^j$ is read out from the RAM 22 and is stored through the path 30 into the index register 28. A check is made to see if this $\alpha^j$ is the zero element or not. When the $\alpha^j$ is the zero element, the division cannot be performed; therefore, a flag (illegal flag) indicative of the abnormality is generated and then the arithmetic operation is finished. When the $\alpha^j$ is not the zero element, the result of which n was added to the content of the index register 28 is supplied as an address through the path 31 into the ROM 21. The exponent j is accessed from the ROM 21 by way of the table in the memory area 25. This exponent j is supplied through the path 33 to the arithmetic operating section 29. In the arithmetic operating section 29, the subtraction of (i−j) is performed and the subtraction result is stored into the accumulator in the arithmetic operating section 29. This arithmetic operation output of (i−j) has a format of (mod. 63) and the value of (i−j) (mod. 63) is stored through the path 34 into the index register 28.

The result of which m was added to the content of the index register 28 is supplied as an address through the path 31 into the ROM 21. The value representing $\alpha^{i-j}$ by a vector is accessed by way of the table in the memory area 26 and is stored through the path 33 into the accumulator in the arithmetic operating section 29. This value representing $(\alpha^i \div \alpha^j)$ by a vector is returned through the path 32 into the RAM 22 as necessary.

The above-mentioned circuit for operating finite fields to which the present invention was applied is used for a decoder of error correction codes, for example, Reed Solomon codes. These error correction codes are used with regard to the subcoding signal which is included in the reproduced signal of the digital audio disc.

Figure 11:
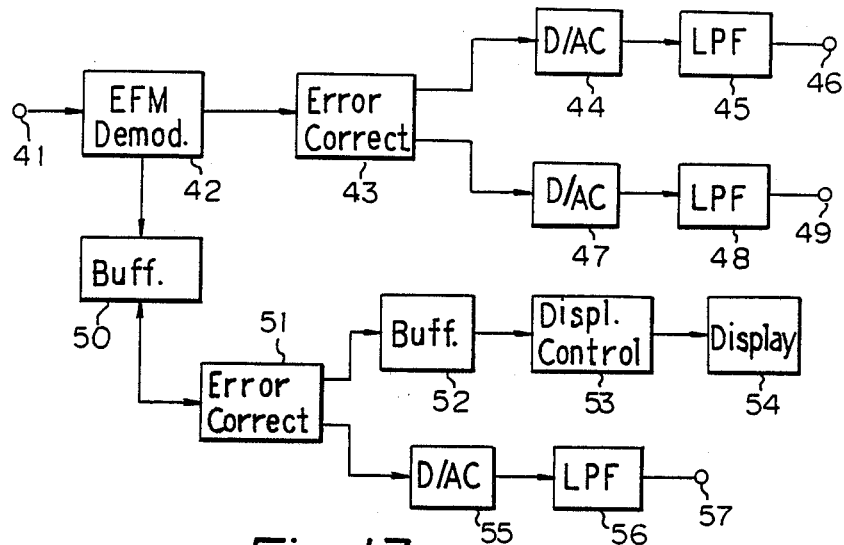
FIG. 11 is a block diagram of a circuit for reproducing a digital audio disc to which the present invention can be applied.

FIG. 11 shows an arrangement of a reproducing circuit of an optical type digital audio disc (what is called a compact disc). The reproduced signal read out from the disc by an optical head is supplied through an input terminal indicated at a reference numeral 41 to an EFM demodulating circuit 42. The digital signal recorded on the disc has been EFM-modulated. The EFM-modulation is a method for block-converting the 8-bit data into a preferable pattern of 14 bits (namely, 14 bits such that the minimum transition time of the modulated signal becomes longer and the low-frequency component becomes less).

The digital audio signal which was returned to the 8-bit data by the EFM demodulator 42 is supplied to an error correcting circuit 43 and the error correction is performed. The digital audio signal in one channel of the stereophonic audio signals which are outputted from the error correction circuit 43 is supplied to a D/A converter 44 and is converted into the analog signal. This analog signal is derived at an output terminal 46 through a low-pass filter 45. The digital audio signal in the other channel which is outputted from the error correction circuit 43 is supplied to a D/A converter 47 and is converted into the analog signal. This analog signal is derived at an output terminal 49 through a lowpass filter 48.

In addition to the stereophonic audio signals, a digital signal for control or display which is called a subcoding signal is included in the reproduced signal from a disc. The subcoding signal of every 8 bits is included in every frame of the recorded data. The subcoding signal is repeated at a period of 98 frames. So that synchronous signal for the subcoding signal is inserted into the first two frames for every 98 frames. Eight bits of the subcoding signal are classified into (P, Q, R, S, T, U, V, W).

The P-channel is used to distinguish the recording interval and pause interval of the music signal recorded on a disc. The Q-channel is constituted by: music numbers added to the respective music signals on a disc; indices to further divide each music program; time codes which increase for the intervals of music programs and decrease for the pause intervals; time codes which sequentially change from the beginning of the program region on a disc; control bits to indicate the presence/absence or the like of a pre-emphasis; etc. With regard to the Q-channel, the CRC codes for error detection are assigned into the 16 frames on the side of the final end among the 98 frames. It is possible to search the beginning of the designated music programs or the like using the subcoding signals in the P- and Q- channels.

Figure 12:
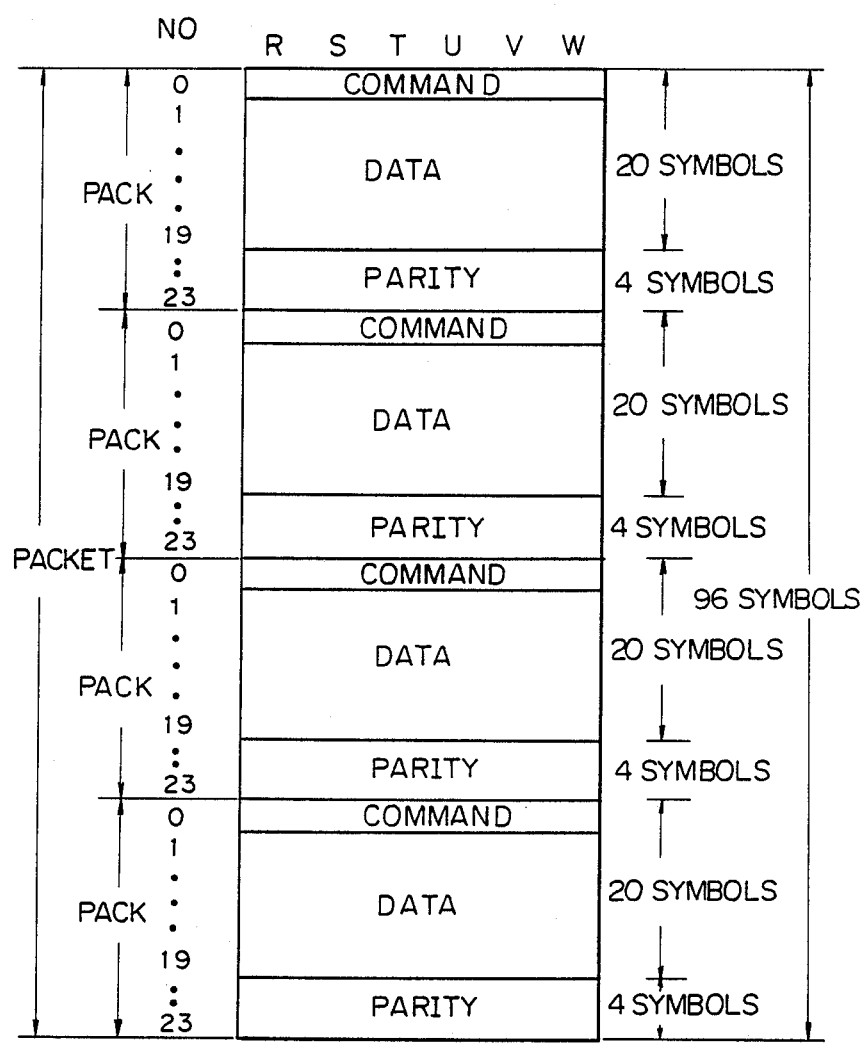
FIG. 12 is a schematic diagram which is used to explain the reproduced data of the digital audio disc.

The R- to W-channels are used to display the songwriter, composers, descriptions, text, etc. of music programs recorded on a disc or to explain them by a voice. One packet is constituted by the data in 96 frames excluded the sync pattern, P-channel and Q-channel from the subcoding signals of (8 bits×98 frames). As shown in FIG. 12, the packet of (6×96) bits is further divided into four packs each consisting of 24 symbols. The first symbol in each pack is a command and the next 19 symbols are data and the remaining four symbols are a parity of the error correction code of each pack. This command has six bits consisting of a mode of three bits and an item of three bits. The kind of data (graphic data, still image data, sound data, etc.) is indicated by three bits of the mode. The information of the detailed operating mode of each mode is represented by three bits of the item.

The foregoing subcoding signals are separated by the EFM demodulator 42 and are stored into a buffer memory 50. The subcoding signals in the R- to W-channels are subjected to the error correction by an error correcting circuit 51. Although not shown, the data in the P- and Q-channels in the subcoding signals are supplied to a system controller. The subcoding signals in the R- to W-channels which are outputted from the error correcting circuit 51 are written into a buffer memory 52 in case of the graphic data or still image data. The data read out from the buffer memory 52 is supplied to a display control circuit 53 and is displayed on a display apparatus 54 such as a CRT display or the like. In the case where the subcoding signals in the R- to W-channels are the sound data, they are derived at an output terminal 57 through a D/A converter 55 and a low-pass filter 56.

Figure 13:
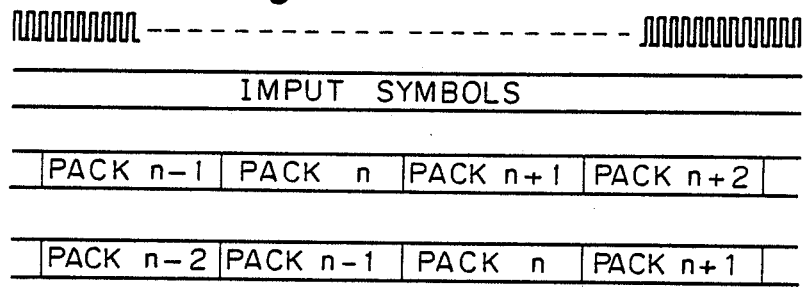
FIGS. 13 and 14 are a time chart and a block diagram which are used to explain an error correcting circuit.

FIG. 13 shows a symbol clock (7.35 kHz) of the subcoding signal in the reproduced data. FIG. 13 shows input symbols. As shown in FIG. 13, the error correction is performed for every one pack in the error correcting circuit 51. The packs which have already been decoded during this error correcting operation are outputted as shown in FIG. 13.

Figure 14:
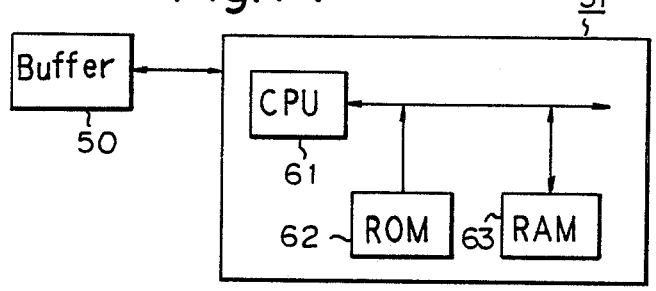

As shown in FIG. 14, the error correcting circuit 51 has a CPU 61, a ROM 62 in which a program has been written, and a RAM 63 for a work area. In the error correction circuit 51, the inputting operation to write 24 symbols of one pack from the buffer memory 50 into the RAM 63, the error correcting operation to perform the arithmetic operation of the syndromes, calculation of the error locations and error corrections by use of the data read out from the RAM 63, and the outputting operation to output the data after the error correction from the RAM 63 are carried out under control of the CPU 61.

As error correction codes with respect to the pack of (6×24) bits, the (24, 20) Reed Solomon codes are used. The primitive polynomial of these Reed Solomon codes is $(P(x)=x^6+x+1)$ over the GF $(2^6)$.

$$HP = \begin{bmatrix} 1 & 1 & 1 \ldots 1 & 1 \\ \alpha^{23} & \alpha^{22} & \alpha^{21} \cdots \alpha^1 & 1 \\ \alpha^{46} & \alpha^{44} & \alpha^{42} \cdots \alpha^2 & 1 \\ \alpha^{69} & \alpha^{66} & \alpha^{63} \cdots \alpha^3 & 1 \end{bmatrix}$$

is used as a parity check matrix Hp. The syndromes are calculated from the matrix expression Vp of the subcoding signals in one pack and the parity check matrix Hp. When reproduced one symbol is expressed as $W_i$, the syndromes $S_0$, $S_1$, $S_2$, and $S_3$ become $$\begin{bmatrix} S_0 \\ S_1 \\ S_2 \\ S_3 \end{bmatrix} = Hp \times Vp = \begin{bmatrix} \Sigma & W_i \\ \Sigma \alpha^i & W_i \\ \Sigma \alpha^{2i} & W_i \\ \Sigma \alpha^{3i} & W_i \end{bmatrix}$$

Where, $\ominus$ denotes $$\sum_{i=0}^{23}.$$

The sizes of errors are checked by way of the syndromes derived from the above equation.

In case of no error, $S_0=0$ and $S_3=0$ and $A=B=C=0$.

In case of one symbol error, $S_0\neq 0$ and $S_3\neq 0$, and $A=B=C=0$.

In case of two symbols error, $A\neq 0$ and $B\neq 0$ and $C\neq 0$, where $(A=S_0 S_1+S_1^2, B=S_1 S_2+S_0 S_3, C=S_1 S_3+S_2^2)$.

The error locations are obtained with regard to the foregoing one-symbol error and two-symbols error, respectively.

When one-symbol error is detected (it is assumed that the error location is i), $$\alpha^i = S_1/S_0$$

$$e_i = S_0$$

so that $i=\log(S_1/S_0)$.

When two-symbols error is detected (it is assumed that the error locations are i and j), $$\alpha^i = D/X$$

$$\alpha^j = (D/Y)$$

$$e_i = S_0/Y + S_1/D$$

$$e_j = S_0/X + S_1/D$$

where, $D=B/A$. X is obtained by setting $E=C/A$ and $(D^2/E \rightarrow X)$ (where, $D^2/E = \alpha^{-a} + \alpha^a$, $X = 1 + \alpha^a$: $a = j - i = 1$ to 23). Y is derived by setting $Y = D^2/E + X$.

For correction of both of the one-symbol error and two-symbols error, the addition of (mod. 2) may be performed with regard to the reproduced erroneous symbols and the error patterns obtained.

The circuit for operating finite fields according to the present invention is applied upon the foregoing error correcting operations. In particular, a multiplication and a division in relation to elements over the GF $(2^6)$ represented by a vector are executed when the error states are checked or when the error patterns are calculated; therefore, it is suitable to apply this invention to such cases. The data transmitting rate of the subcoding signal on a digital disc is lower than that of the data in the main channel and the error correcting circuit 51 of the subcoding signal can be constituted using a general microcomputer by applying this invention.

According to the present invention, the multiplication of $(\alpha^i \times \alpha)$ and division of $(\alpha^i \div \alpha)$ over a finite field can be performed as elements over the finite field are represented by a vector without using any ROM and without needing a discrimination of an exponent in (mod. $2^m - 1$). Therefore, the scale of the hardware can be made small and the number of steps for arithmetic operation can be remarkably reduced. By applying this invention to a decoder of the Reed Solomon codes, the hardware of the decoder can be simplified and also the decoding time can be reduced.

In addition, according to the present invention, since a multiplication or a division of arbitrary two elements can be performed as elements over a finite field are represented by a vector, a general microcomputer can be used as a hardware. Consequently, the hardware can be cheaply realized.

We claim:

1. A circuit for operating a multiplication or a division in relation to the arbitrary elements $\alpha^i$ and $\alpha$ over a finite field, where $\alpha$ is a root of a primitive polynomial of said finite field, comprising:
    an accumulator for storing said arbitrary element $\alpha^i$;
    a register for storing a vector representation of said primative polynomial, corresponding to the root $\alpha$;
    an adder for performing a (mod. 2) addition using as operands the contents of said accumulator and signals from said register; and
    a control section for controlling the bit-shift in said accumulator and the operation of said adder in accordance with a program.

2. A method for operating a multiplication or a division in relation to arbitrary elements $\alpha^i$ (where i is an integer) and $\alpha$ over a finite field of $2^m$ (where m is a positive integer), where $\alpha$ is a root of a primitive polynomial of the finite field, the method comprising the steps of:
    storing first digital data of at least m+1 bits corresponding to a vector representation of the primitive polynomial;
    storing second digital data of m bits corresponding to a vector representation of the arbitrary element $\alpha^i$;
    shifting the second digital data by one bit to the most significant bit side in a case of multiplication or to the least significant bit side in a case of division;
    discriminating the m-th significant bit in the case of multiplication or the least significant bit in the case of division of the shifted second digital data;
    outputting the shifted second digital data, when the m-th significant bit in the case of multiplication or the least significant bit in the case of division of the shifted second digital data is "0"; and
    modulo-2-adding the first digital data and the shifted second digital data to producing sum data and outputting the sum data when the m-th significant bit in the case of multiplication or the least significant bit in the case of division of the shifted second digital data is not "0", when the m-th significant bit in the case of multiplication or the least significant bit in the case of division of the shifted second digital data is not "0".

3. A circuit for operating a multiplication or a division in relation to arbitrary elements $\alpha^i$ (where i is an integer) and $\alpha$ over a finite field of $2^m$ (where m is a positive integer), where $\alpha$ is a root of a primative polynomial of the finite field, comprising:

first memory means for storing first digital data of at least m+1 bits corresponding to a vector representation of the primitive polynomial;

second memory means for storing second digital data of m bits corresponding to a vector representation of the arbitrary element $\alpha^i$;

accumulator means having a capacity of at least m+1 bits and connected to said second memory mean;

third memory means connected between the most significant bit end and the least significant bit end of said accumulator means and for storing third digital data of 1 bits corresponding to a digital value of "0"; said adder means connected to said first memory means and accumulator means and for modulo-2-adding the contents of said accumulator means and the first digital data from said first memory means as operands;

program memory means for storing a program;

control means for controlling the loading of the second digital data from said second memory means into said accumulator means and for shifting the contents of said accumulator means by one bit to the most significant bit side in a case of multiplication or to the least significant bit side in a case of division;

discriminating means for discriminating the m-th significant bit in the case of multiplication or the least significant bit in the case of division of the contents of said accumulator means and for producing a control signal to be provided to said program memory means; and said control means further controlling the addition of the contents of said accumulator means and the first digital data from said first memory means in said adder means so as to produce sum data, according to the control signal from said discriminating means, and for storing said sum data or the contents of said accumulator means into said second memory means.

* * * * *